(12) United States Patent
Chiang et al.

(10) Patent No.: US 8,420,478 B2
(45) Date of Patent: Apr. 16, 2013

(54) CONTROLLED LOCALIZED DEFECT PATHS FOR RESISTIVE MEMORIES

(75) Inventors: Tony Chiang, Campbell, CA (US); Prashant Phatak, San Jose, CA (US); Michael Miller, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 657 days.

(21) Appl. No.: 12/610,131

(22) Filed: Oct. 30, 2009

(65) Prior Publication Data

US 2010/0243983 A1 Sep. 30, 2010

Related U.S. Application Data

(60) Provisional application No. 61/165,407, filed on Mar. 31, 2009.

(51) Int. Cl.
*H01L 21/8234* (2006.01)

(52) U.S. Cl.
USPC .......................................... 438/238; 438/382

(58) Field of Classification Search .................. 438/238, 438/381, 382, 783, 785
See application file for complete search history.

(56) References Cited

U.S. PATENT DOCUMENTS

| | | | |
|---|---|---|---|
| 6,835,949 B2 | 12/2004 | Weiss et al. | |
| 6,944,052 B2 | 9/2005 | Sumramanian et al. | |
| 6,965,137 B2 | 11/2005 | Kinney et al. | |
| 7,038,935 B2 | 5/2006 | Rinerson et al. | |
| 7,067,862 B2 | 6/2006 | Rinerson et al. | |
| 7,157,783 B2 | 1/2007 | Marsh | |
| 7,372,065 B2 | 5/2008 | Kozicki et al. | |
| 7,420,198 B2 | 9/2008 | Baek et al. | |
| 7,495,947 B2 | 2/2009 | Scheuerlein et al. | |
| 7,551,473 B2 | 6/2009 | Lung et al. | |
| 7,569,459 B2 | 8/2009 | Karg et al. | |
| 7,615,769 B2 | 11/2009 | Kim | |
| 8,062,918 B2 * | 11/2011 | Miller et al. | 438/45 |
| 2004/0043578 A1 | 3/2004 | Marsh | |
| 2006/0073657 A1 | 4/2006 | Herner et al. | |
| 2006/0076549 A1 | 4/2006 | Ufert | |
| 2006/0245243 A1 | 11/2006 | Rinerson et al. | |
| 2006/0250836 A1 | 11/2006 | Herner et al. | |
| 2006/0250837 A1 | 11/2006 | Herner et al. | |
| 2006/0255392 A1 | 11/2006 | Cho et al. | |
| 2006/0289942 A1 * | 12/2006 | Horii et al. | 257/379 |

(Continued)

FOREIGN PATENT DOCUMENTS

| | | |
|---|---|---|
| GB | 2344694 A | 6/2000 |
| KR | 10-2000-0048092 A | 3/2004 |
| KR | 10-2006-0117023 A | 11/2006 |
| KR | 10-2007-0062435 A | 6/2007 |

OTHER PUBLICATIONS

International Search Report, PCT Application PCT/US2009/042424, Dec. 14, 2009.

(Continued)

*Primary Examiner* — Kevin M Picardat

(57) ABSTRACT

Controlled localized defect paths for resistive memories are described, including a method for forming controlled localized defect paths including forming a first electrode forming a metal oxide layer on the first electrode, masking the metal oxide to create exposed regions and concealed regions of a surface of the metal oxide, and altering the exposed regions of the metal oxide to create localized defect paths beneath the exposed regions.

16 Claims, 12 Drawing Sheets

U.S. PATENT DOCUMENTS

| | | |
|---|---|---|
| 2007/0008773 A1 | 1/2007 | Scheuerlein |
| 2007/0008785 A1 | 1/2007 | Scheuerlein |
| 2007/0114509 A1 | 5/2007 | Herner |
| 2007/0132049 A1 | 6/2007 | Stipe |
| 2007/0164309 A1 | 7/2007 | Kumar et al. |
| 2007/0164388 A1 | 7/2007 | Kumar et al. |
| 2007/0228354 A1 | 10/2007 | Scheuerlein |
| 2007/0236981 A1 | 10/2007 | Herner |
| 2007/0252193 A1 | 11/2007 | Cho et al. |
| 2007/0267667 A1 | 11/2007 | Ufert |
| 2007/0285967 A1 | 12/2007 | Toda et al. |
| 2007/0295950 A1 | 12/2007 | Cho et al. |
| 2008/0001172 A1 | 1/2008 | Karg et al. |
| 2008/0006907 A1 | 1/2008 | Lee et al. |
| 2008/0011996 A1 | 1/2008 | Bednorz et al. |
| 2008/0090337 A1 | 4/2008 | Williams |
| 2008/0164568 A1 | 7/2008 | Lee et al. |
| 2008/0203377 A1 | 8/2008 | Choi et al. |
| 2008/0211036 A1 | 9/2008 | Zhao et al. |
| 2008/0316796 A1 | 12/2008 | Herner |
| 2009/0003083 A1 | 1/2009 | Meeks et al. |
| 2009/0026434 A1 | 1/2009 | Malhotra et al. |
| 2009/0134431 A1 | 5/2009 | Tabata et al. |
| 2009/0268508 A1 | 10/2009 | Chen et al. |
| 2009/0272959 A1 | 11/2009 | Phatak et al. |
| 2009/0272961 A1 | 11/2009 | Miller et al. |
| 2009/0272962 A1 | 11/2009 | Kumar et al. |

OTHER PUBLICATIONS

Chen et al., HfOx Thin Films for Resistive Memory Device by Use of Atomic Layer Deposition, Mater. Res. Soc. Symp. Proc., 2007, vol. 997, Materials Research Society.

Inoue et al., Nonpolar resistance switching of metal/binary-transition-metal oxides/metal sandwiches: homogenous/ inhomogenous transition of current distribution., Phys. Rev. B 77, 035105 (2008), American Physical Society.

Kim et al., Anode-interface localized filamentary mechanism in resistive switching of TiO2 thin films, Applied Physics Letters, Jul. 6, 2007, pp. 012907-1-012907-3, vol. 91, American Institute of Physics.

Lee et al., Low Power Switching of Nonvolatile Resistive Memory Using Hafnium Oxide, Japanese Journal of Applied Physics, Apr. 24, 2007, pp. 2175-2179, vol. 46, No. 4B, The Japan Society of Applied Physics.

Lee et al., Resistance Switching Behaviors of Hafnium Oxide Films Grown by MOCVD for Nonvolatile Memory Applications, Journal of the Electrochemical Society, Dec. 6, 2007, pp. H92-H96, vol. 155 (2), The Electrochemical Society.

Sanchez et al., A mechanism for unipolar resistance switching in oxide nonvolatile memory devices, Dec. 17, 2007, Applied Physics Letters, pp. 252101-1-252101-3, vol. 91, American Institute of Physics.

Yang et al., Memristive switching mechanism for metal/oxide/metal nanodevices, Jun. 15, 2008, Nature Nanotechnology, pp. 429-433, vol. 3, Jul. 2008, Macmillan Publishers Limited.

Smyth, The defect chemistry or metal oxides, Chapters 1-5, 8, 9, and 12, pp. 1-74, 118-161, and 217-237, 2000, Oxford University Press, Inc.

Baek et al., Highly Scalable Non-volatile Resistive Memory using Simple Binary Oxide Driven by Asymmetric Unipolar Voltage Pulses, 2004, IEEE, pp. 23.6.1-23.6.4, IEDM 04-587.

Toriumi et al., Doped HfO2 for Higher-k Dielectrics, 208th ECS Meeting, Abstract #508, 2005, The Electrochemical Society.

Lee et al., HfOx Biploar Resistive Memory with Robust Endurance Using AlCu as Buffer Electrode, Jul. 2009, IEEE Electron Device Letters, vol. 30, No. 7, pp. 703-705, IEEE.

International Search Report, PCT Application PCT/US2009/041582, Dec. 14, 2009.

International Search Report, PCT Application PCT/US2009/041583, Nov. 30, 2009.

Chan et al., Resistive switching effects of HfO2 high-k dielectric, Sep. 25, 2008, Microelectronic Engineering, pp. 2420-2424, vol. 85, Elsevier B.V.

Chen et al., Highly Scalable Hafnium Oxide Memory with Improvements of Resistive Distribution and Read Disturb Immunity, 2009, IEEE, pp. IEDM09-105-IEDM09-108.

U.S. Appl. No. 12/608,934, filed Oct. 29, 2009.
U.S. Appl. No. 12/610,236, filed Oct. 30, 2009.
U.S. Appl. No. 12/705,474, filed Feb. 12, 2010.

* cited by examiner

CONTROLLED LOCALIZED DEFECT PATHS FOR RESISTIVE MEMORIES

PRIORITY CLAIM TO PROVISIONAL APPLICATION

A claim for priority is hereby made under the provisions of 35 U.S.C. §119 for the present application based upon U.S. Provisional Application No. 61/165,407 entitled "Controlled Localized Defect Paths for Resistive Memories" and filed on Mar. 31, 2009, which is incorporated herein by reference.

FIELD OF THE INVENTION

The present invention relates generally to semiconductor memories. More specifically, controlled localized defect paths for resistive memories are described.

BACKGROUND OF THE INVENTION

Nonvolatile memories are memories that retain their contents even when unpowered. Nonvolatile memories have a variety of uses, from storage for portable devices to rewriteable memories in embedded systems. Several types of nonvolatile memories are commonly available, including electronically erasable programmable read only memory (EEPROM)-type memories such as flash memory. These memories can be slow and are therefore of limited utility as the throughput requirements of devices using nonvolatile memories increase.

Resistive random access memory (ReRAM) is an emerging memory type that is nonvolatile but potentially fast enough to replace both memories that are currently nonvolatile (e.g. flash memories), and random access memories (e.g. dynamic RAM) that currently use volatile memory technologies. ReRAM is a memory element that changes resistance when a voltage is applied across the element. One voltage (e.g. a "set" voltage $V_{set}$) is used to switch to a low resistance state, while another voltage (e.g. a "reset" voltage $V_{reset}$) is used to switch to a high resistance state. Another voltage can be applied to determine the resistance of the memory element, thereby reading the contents of the memory element.

In addition to set and reset voltages, various other operating parameters (e.g. on and off current ratios, forming voltages, etc.) of a ReRAM memory element can affect the performance of the memory element. For example, it may be desirable to use a ReRAM memory element that has low set, reset, and forming voltages, while having a high on and off current ratio. Thus, what is needed is a ReRAM memory element that has improved control over critical operating parameters.

BRIEF DESCRIPTION OF THE DRAWINGS

Various embodiments of the invention are disclosed in the following detailed description and the accompanying drawings.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments, a resistive switching nonvolatile memory including controlled localized defect paths is described. Switching parameters of the memory can be improved and greater control exerted thereover by forming localized defect paths in a metal oxide layer of the ReRAM memory element. In some embodiments of the invention, the localized defect paths can be created by selectively altering the metal oxide layer, for example using ion implantation or another doping process (e.g. co-sputtering, alloy sputtering, ALD deposition, etc.). A metal oxide layer of the memory element can be altered using masking techniques to form the localized paths in some areas of the metal oxide layer, while other areas of the metal oxide layer are not altered. The localized defect paths can enhance the operation of a ReRAM element using any type of conduction mechanism: percolation paths, filamentary, ion transport, trap modulated space charge limited current (SCLC), etc. In addition, localized defect paths in the metal oxide layers can be tailored to gain greater control over a variety of characteristics of the memory element, including improvements in set and reset voltages, on/off current ratio, forming voltages, etc.

I. Memory Structure

Figure 1:
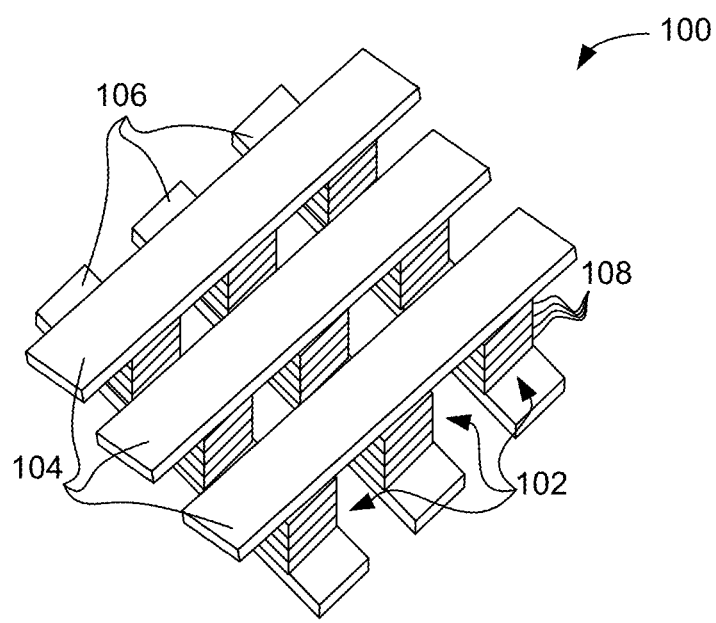
FIG. 1 illustrates a memory array of resistive switching memory elements.

FIG. 1 illustrates a memory array 100 of resistive switching memory elements 102. Memory array 100 may be part of a memory device or other integrated circuit. Memory array 100 is an example of potential memory configurations; it is understood that several other configurations are possible.

Read and write circuitry may be connected to memory elements 102 using signal lines 104 and orthogonal signal lines 106. Signal lines such as signal lines 104 and signal lines 106 are sometimes referred to as word lines and bit lines and are used to read and write data into the elements 102 of array 100. Individual memory elements 102 or groups of memory elements 102 can be addressed using appropriate sets of signal lines 104 and 106. Memory element 102 may be formed from one or more layers 108 of materials, as is described in further detail below. In addition, the memory arrays shown can be stacked in a vertical fashion to make multi-layer 3-D memory arrays.

Any suitable read and write circuitry and array layout scheme may be used to construct a non-volatile memory device from resistive switching memory elements such as element 102. For example, horizontal and vertical lines 104 and 106 may be connected directly to the terminals of resistive switching memory elements 102. This is merely illustrative.

Figure 6A:
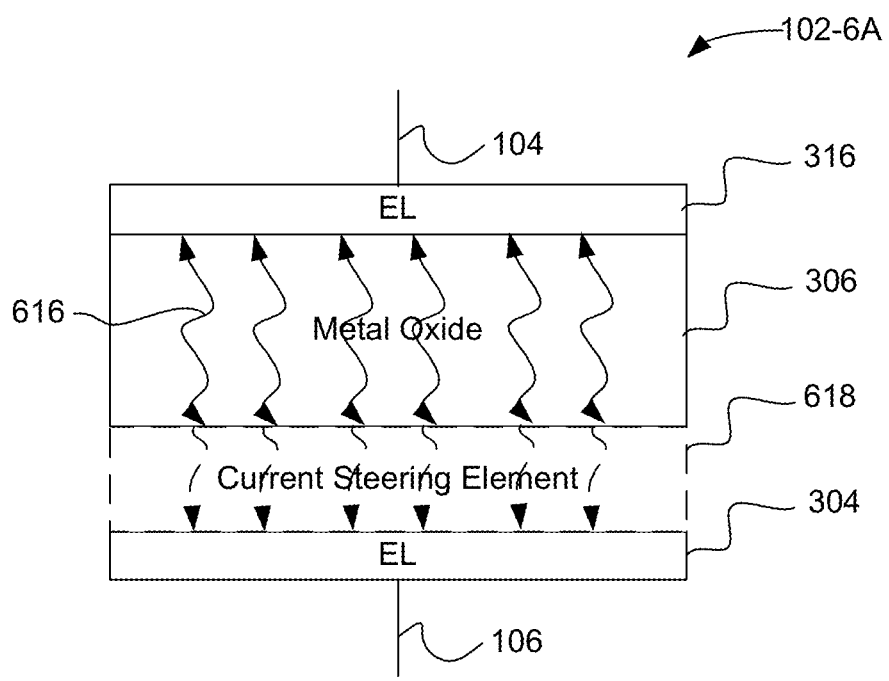
FIG. 6A illustrates an exemplary memory element according to various embodiments.

If desired, other electrical devices may be associated (i.e. be one or more of the layers 108) with each memory element 102 (see, e.g. FIG. 6A). These devices, which are sometimes referred to as current steering elements, may include, for example, diodes, p-i-n diodes, silicon diodes, silicon p-i-n diodes, transistors, Schottky diodes, etc. Current steering elements may be connected in series in any suitable locations in memory element 102.

II. Memory Operation

A. Basic Operation

During a read operation, the state of a memory element 102 can be sensed by applying a sensing voltage (i.e. a "read" voltage) to an appropriate set of signal lines 104 and 106. Depending on its history, a memory element that is addressed in this way may be in either a high resistance state or a low resistance state. The resistance of the memory element therefore determines what digital data is being stored by the memory element. If the memory element has a low resistance, for example, the memory element may be said to contain a logic one (i.e. a "1" bit). If, on the other hand, the memory element has a high resistance, the memory element may be said to contain a logic zero (i.e. a "0" bit). During a write operation, the state of a memory element can be changed by application of suitable write signals to an appropriate set of signal lines 104 and 106.

Figure 2A:
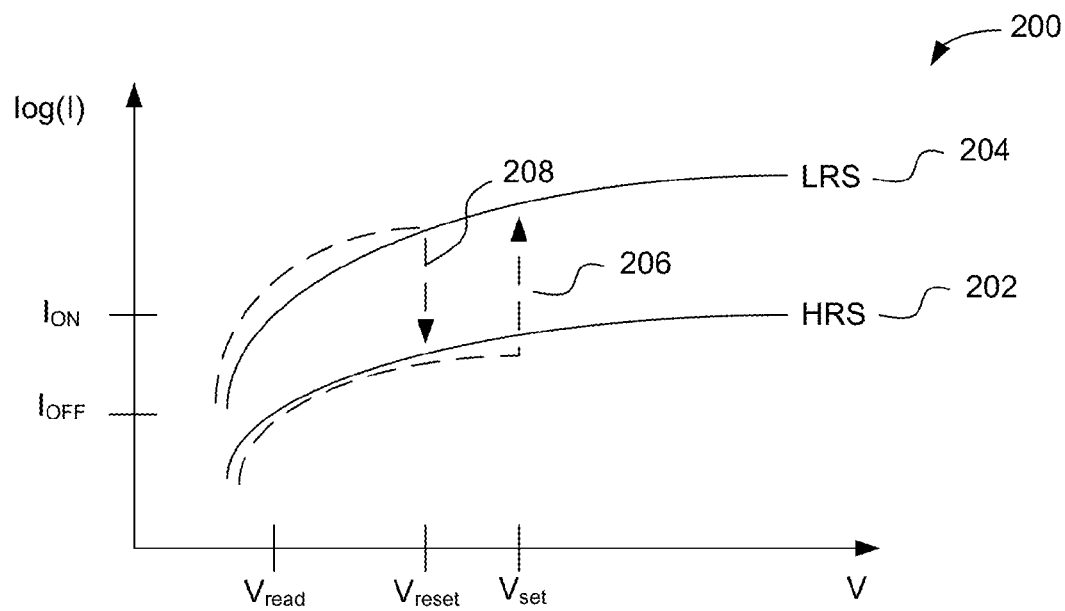
FIG. 2A is a logarithm of current (I) versus voltage (V) plot for a memory element.

FIG. 2A is a logarithm of current (I) versus voltage (V) plot 200 for a memory element 102. FIG. 2A illustrates the set and reset operations to change the contents of the memory element 102. Initially, memory element 102 may be in a high resistance state ("HRS", e.g. storing a logic zero). In this state, the current versus voltage characteristic of memory element 102 is represented by solid line HRS 202. The high resistance state of memory element 102 can be sensed by read and write circuitry using signal lines 104 and 106. For example, read and write circuitry may apply a read voltage $V_{READ}$ to memory element 102 and can sense the resulting "off" current $I_{OFF}$ that flows through memory element 102. When it is desired to store a logic one in memory element 102, memory element 102 can be placed into its low-resistance state. This may be accomplished by using read and write circuitry to apply a set voltage $V_{SET}$ across signal lines 104 and 106. Applying $V_{SET}$ to memory element 102 causes memory element 102 to switch to its low resistance state, as indicated by dashed line 206. In this region, the memory element 102 is changed so that, following removal of the set voltage $V_{SET}$, memory element 102 is characterized by low resistance curve LRS 204. As is described further below, in one embodiment the change in the resistive state of memory element 102 may be trap-mediated in a metal oxide material.

The low resistance state of memory element 102 can be sensed using read and write circuitry. When a read voltage $V_{READ}$ is applied to resistive switching memory element 102, read and write circuitry will sense the relatively high "on" current value $I_{ON}$, indicating that memory element 102 is in its low resistance state. When it is desired to store a logic zero in memory element 102, the memory element can once again be placed in its high resistance state by applying a reset voltage $V_{RESET}$ to memory element 102. When read and write circuitry applies $V_{RESET}$ to memory element 102, memory element 102 enters its high resistance state HRS, as indicated by dashed line 208. When the reset voltage $V_{RESET}$ is removed from memory element 102, memory element 102 will once again be characterized by high resistance line HRS 204. Unipolar and bipolar voltage pulses can be used in the programming of the memory element 102.

A forming voltage $V_{FORM}$ is a voltage applied to the memory element 102 to ready the memory element 102 for use. Some memory elements described herein may need a forming event that includes the application of a voltage greater than or equal to the set voltage or reset voltage. Once the memory element 102 initially switches, the set and reset voltages can be used to change the resistance state of the memory element 102.

The bistable resistance of resistive switching memory element 102 makes memory element 102 suitable for storing digital data. Because no changes take place in the stored data in the absence of application of the voltages $V_{SET}$ and $V_{RESET}$, memory formed from elements such as element 102 is non-volatile. As can be appreciated, it is desirable for memory element 102 to have a large difference between off current and on current (i.e. a high $I_{ON}/I_{OFF}$ ratio), which causes the on and off states of the memory element to be more discrete and easily detectable.

Figure 2B:
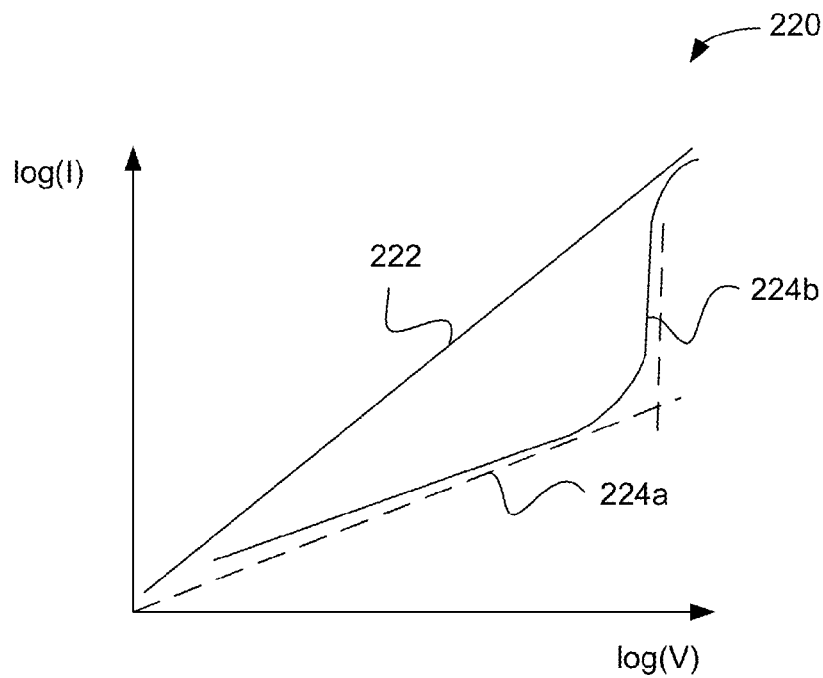
FIG. 2B is a logarithm of current (I) versus logarithm voltage (V) plot for a memory element that demonstrates a resistance state change.

FIG. 2B is a current (I) versus voltage (V) plot 220 for a memory element 102 that demonstrates a resistance state change. The plot 220 shows a voltage ramp applied to the memory element 102 along the x-axis and the resulting current along a y-axis. The line 222 represents the response of an Ohmic material when the ramped voltage is applied. An Ohmic response is undesirable, since there is no discrete voltage at which the set or reset occurs.

Generally, a more abrupt response like graph 224 is desired. The graph 224 begins with an Ohmic response 224*a*, and then curves sharply upward 224*b*. The graph 224 may represent a set operation, where the memory element 102 switches from the HRS 202 to the LRS 204.

B. Conduction Mechanisms

Conduction paths can be formed in metal oxide layers of a metal-insulator-metal (MIM)-style resistive-switching memory element. As used herein, MIM-style resistive-switching memory elements can also include those containing conductive semiconductor layers (e.g. metal-insulator-semiconductor or MIS structures). Conduction paths can be used to increase the conductivity of a resistive-switching memory element during a set operation, thereby reducing the resistance and changing the value stored by the memory element. Various conduction mechanisms can be used with the embodiments described herein, including percolation paths, filaments, ion transport, and trap-modulated SCLC. The embodiments are not limited to any specific conduction mechanism, and tailored defect paths, including tailoring spatial location, can be used to enhance the aforementioned types of conduction mechanism.

Some embodiments can use percolation paths to change the resistance of the memory element. In some embodiments, and without being bound by theory, non-metallic percolation paths are formed during a set operation and broken during a reset operation. For example, during a set operation, the memory element 102 switches to a low resistance state. The percolation paths that are formed by filling traps which would otherwise impeded current flow increase the conductivity of the metal oxide, thereby reducing (i.e. changing) the resistivity. The voltage represented by 224b is the set voltage. At the set voltage, the traps are filled and there is a large jump in current as the resistivity of the metal oxide decreases. Percolation paths are illustrated in FIG. 6A.

The set voltage shown here is very discrete (i.e. vertical), which is desirable to ensure the switching of the memory element occurs at a repeatable voltage. Additionally, a high ratio of on current to off current (i.e. a high $I_{ON}/I_{OFF}$ ratio), for example 10 or greater, is desirable because it indicates a large difference in the resistivity of the metal oxide when in the HRS and LRS, making the state of the memory element easier to determine. Finally, it is desirable to have low set, reset, and switching voltages in order to avoid damage to the memory elements and to be compatible with complementary device elements such as diodes and/or transistors in series with the memory element 102 (see FIG. 6A).

In some embodiments, the percolation paths can be described as non-metallic. With metallic materials, resistivity decreases with lower temperature. The memory elements 102 described herein demonstrate an increase in resistance (e.g. the LRS) with decreases in operating temperatures. In other embodiments, metallic filaments, ion transport (e.g. using ion reservoirs) can be enhanced by localized defect path formation.

III. Memory Element Including Localized Defect Paths

As is described further below, native and introduced defects in a metal oxide layer of an MIM-style memory element can be exploited to form a working ReRAM element. Defects, such as traps (i.e. electrically active defects), can form charge imbalances in a crystal structure of a metal oxide material. Traps can be filled and emptied by applying set and reset voltages to change the resistivity of the metal oxide layer, thereby changing the value stored by the memory element. The memory element 102, as described above, is connected to signal lines 104 and 106, and includes multiple layers 108. The layers 108 can include metal and insulator layers in an MIM structure, for example.

FIGS. 3A-3E illustrates the formation of a memory element 102 according to various embodiments described herein. FIG. 4 is a flowchart describing a process 400 for forming the memory element 102. The memory element 102 described herein is an MIM-style nonvolatile memory element that exhibits changes in resistance when voltage is applied across the electrodes of the memory element 102. It is believed that the formation of conduction paths such as percolation paths, trap-modulated SCLC, filaments, or ion transport paths can be used to effect the change in resistivity of a metal oxide insulator. To help form and exert greater control over the conduction paths, defect paths can be created using the techniques described herein.

Figure 3A:
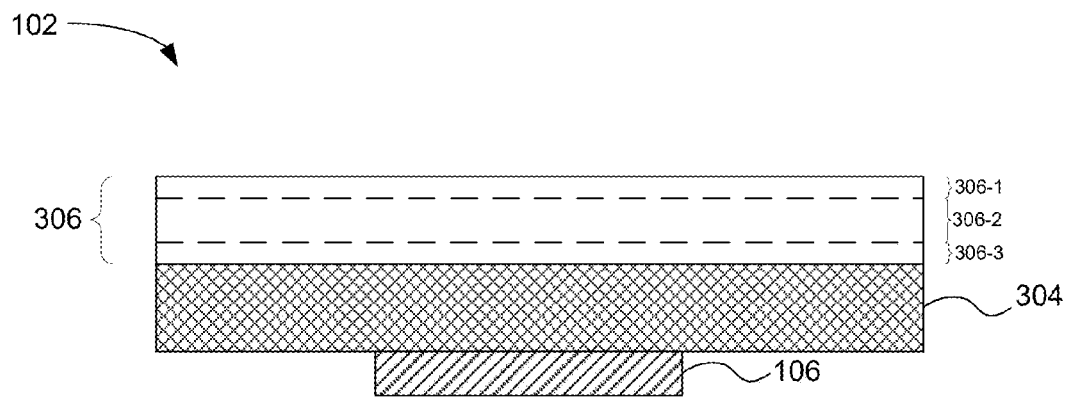
FIGS. 3A-3E illustrates the formation of a memory element according to various embodiments described herein.
Figure 4:
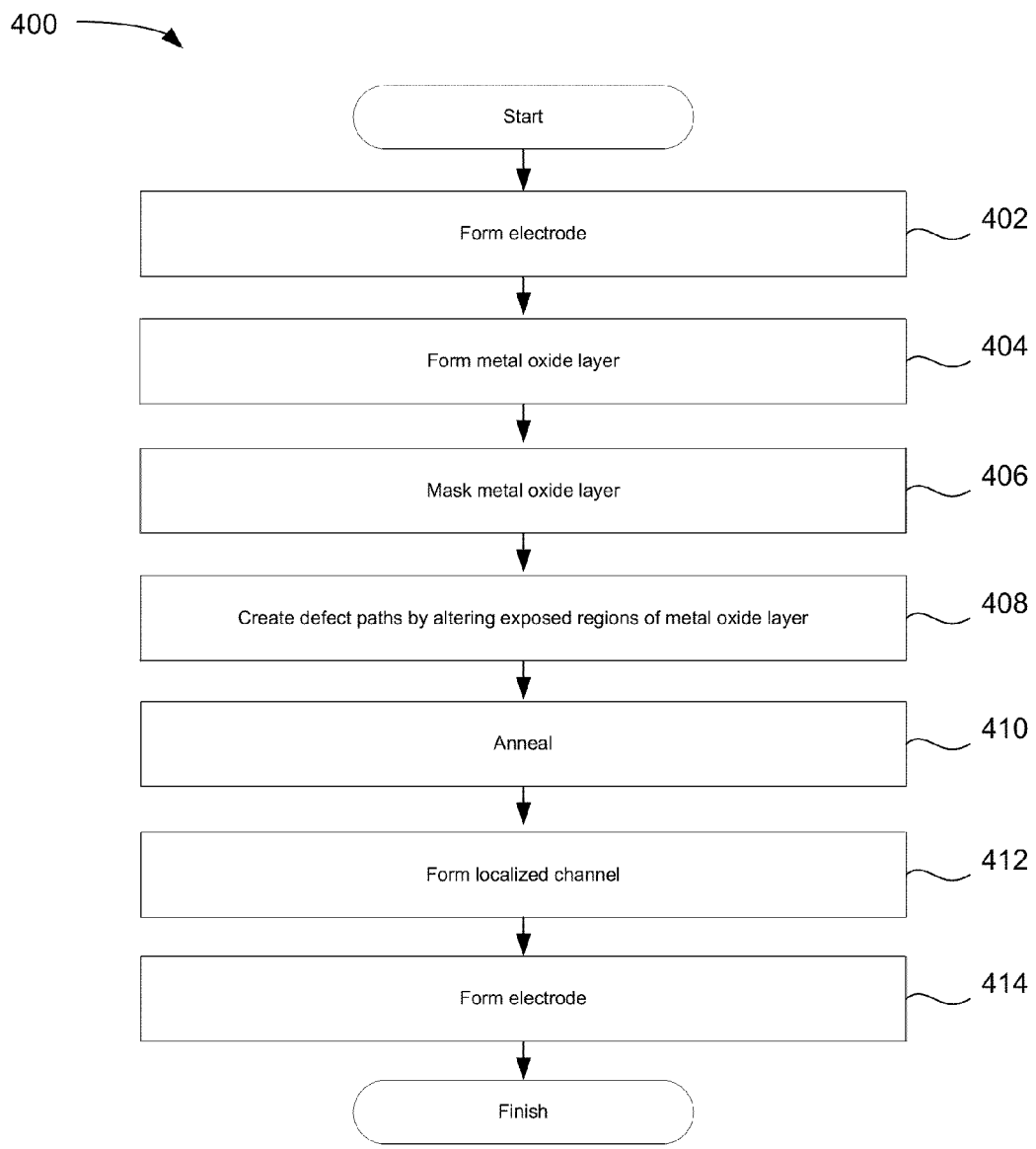
FIG. 4 is a flowchart describing a process for forming the memory element in FIGS. 3A-3E.

FIG. 3A illustrates a signal line 106, an electrode 304, and a metal oxide layer 306 that may form a portion of the memory element 102. The signal line 106 may be tungsten or another conductor and may be a bit line or a word line in a memory array, for example. The electrode 304 is a conductive layer (e.g. one of the layers 108) in the memory element 102, and may comprise any electrode material such as titanium nitride, doped silicon, doped polysilicon, tungsten, tungsten nitride, molybdenum nitride, tantalum nitride, molybdenum oxide, cobalt silicide, nickel silicide, palladium silicide, platinum silicide, titanium silicide, other silicides, nickel, platinum, iridium, iridium oxide, ruthenium, or ruthenium oxide. According to certain embodiments, and as described further below (see e.g. FIG. 6A), the electrode 304 may have a different work function than the other electrode in the memory element 102. For example, in some embodiments, the work function of one electrode can be 0.1 to 2.0 eV, 0.1 to 1.0 eV, 0.4 to 0.6 eV, etc. greater than the work function of the other electrode. An example can be a memory element 102 that includes an n-type polysilicon electrode (work function=4.1 to 4.15 eV) and a titanium nitride electrode (work function=4.5 to 4.65 eV).

The memory element 102 can use unipolar or bipolar switching voltages. In some embodiments, for example, bipolar switching voltages are used and a positive reset pulse (relative to a common electrical reference) is applied to the higher work function electrode, and a negative set pulse (relative to the common electrical reference) is applied to the higher work function electrode. However, in other embodiments, a negative reset pulse and a positive set pulse can be applied to the higher work function electrode.

In operation 402, the electrode 304 is formed. The electrode 304 can be formed on a substrate, for example, a silicon substrate that may include one or more layers already formed thereon. The electrode 304 may be formed over the signal line 106. The electrode 304 can be titanium nitride, doped silicon, doped polysilicon, tungsten, tungsten nitride, molybdenum nitride, tantalum nitride, molybdenum oxide, cobalt silicide, nickel silicide, palladium silicide, platinum silicide, titanium silicide, other silicides, nickel, platinum, iridium, iridium oxide, ruthenium, ruthenium oxide, or other appropriate materials. In one example, a titanium nitride electrode is formed using PVD or another process described above. For example, the electrode 304 can be sputtered by using a metal target at 150-500 W with a pressure of 2-10 mTorr for a deposition rate of approximately 0.5-5 Å/s. These specifications are given as examples, the specifications can vary greatly depending on the material to be deposited, the tool used to deposit the material, and the desired speed of deposition. The duration of the sputtering can determine the thickness of the electrode. Other processing techniques, such as atomic layer deposition (ALD), pulse laser deposition (PLD), chemical vapor deposition (CVD), plasma enhanced CVD (PECVD), plasma enhanced ALD (PEALD), evaporation, etc. can also be used to deposit the electrode 304. The electrode 304 may have a thickness of, but not limited to, for example 10 Å-2000 Å

The metal oxide layer 306 is an insulator layer in the MIM-style stack. The metal oxide layer 306 may include one or more layers of metal oxide material, including one or more of hafnium oxide, titanium oxide, aluminum oxide, zirconium oxide, niobium oxide, hafnium titanium oxide, hafnium aluminum oxide, lanthanum oxide, and molybdenum oxide. In some embodiments, and as is further explained below, it may be desirable to use a metal oxide layer having a bandgap greater than 4 electron volts (eV), which can be scalable and have other benefits. In some embodiments the metal oxide layer 306 may include multiple layers of different metal oxide materials. The metal oxide layer 306 may comprise multiple layers; for example layer 306-2 and either or both of layers 306-1 and 306-3. The layers 306-1 and 306-3 may be modified portions of the base layer 306-2. For example, the metal oxide layer 306 may be a deposited hafnium oxide layer, and the layers 306-1 and 306-3 include other materials created through doping by diffusion. In other embodiments, the layers 306-1 and/or 306-3 may be separately deposited layers, and may therefore include different metal oxide materials (e.g. titanium oxide with hafnium oxide). The thicknesses of the layers 306-1, 306-2, and 306-3 may differ depending on the design of the memory element 300. For example, the thickness of the entire metal oxide layer 306 may range from 50-1000 Å, while the layers 306-1 and 306-3 may be 5-50 Å. See the description of FIGS. 6A and 7A-7C for more details on multiple layer and material systems. It is understood that any resistive switching memory elements can be used with the embodiments described in FIGS. 3A-3E and 4, including all of those described elsewhere herein.

In operation 404, the metal oxide layer 306 is formed. The metal oxide layer similarly can be deposited using wet or dry techniques such as those described above. The metal oxide layer 306 can be deposited monolithically or as separate layers of different metal oxide materials depending on the design of memory element 300. For example, the metal oxide layer 306 may be a 5-500 Å hafnium oxide layer formed using reactive sputtering with a metal hafnium target, a power of 100-1000 Watts (W), and a 20-60% oxygen atmosphere for a deposition rate of 0.1-1.0 Å/s. It is understood that the specifications for sputtering can vary greatly depending on tool used and desired deposition rate, and that these specifications are given as examples. In other embodiments a hafnium oxide target can be used, and different thicknesses can be formed. In a further embodiment, ALD can be used, for example to form a hafnium oxide layer using hafnium precursors such as tetrakis (diethylamido) hafnium (TDEAHf), tetrakis (dimethylamido) hafnium (TDMAHf), tetrakis (ethylmethylamido) hafnium (TEMAHf) or hafnium chloride ($HfCl_4$) and a suitable oxidant such as water, oxygen plasma, or ozone. Other deposition techniques, such as PLD, CVD, PECVD, PEALD, or evaporation can also be used. These deposition techniques can also be used to deposit other metal oxides (e.g. titanium oxide, tantalum oxide, aluminum oxide, etc.) described herein. Specifications for depositing these materials depend on the tool used and the material to be deposited.

Figure 3B:
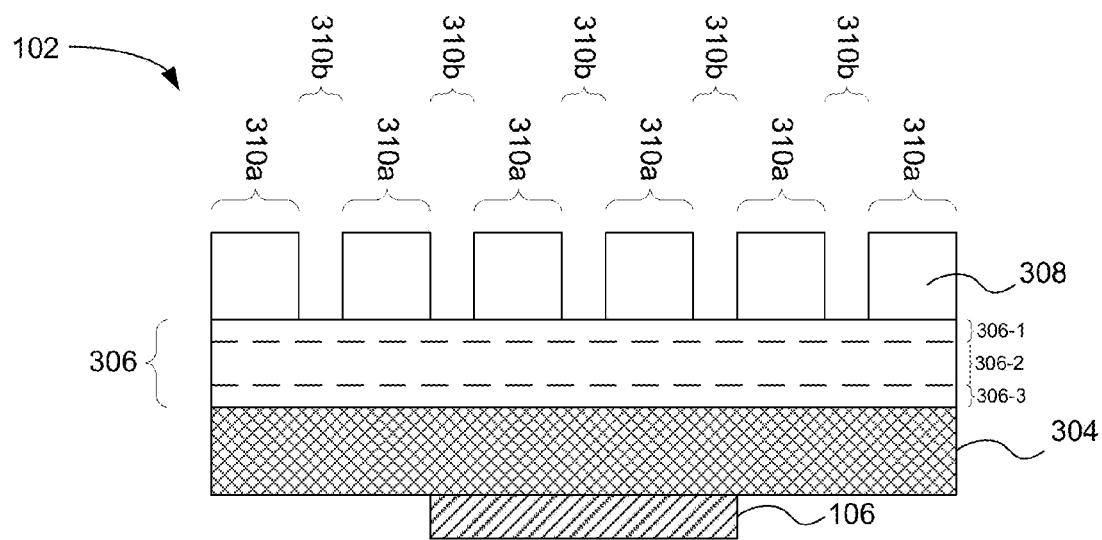

FIG. 3B illustrates the memory element 102 include a masking material 308 deposited thereon. In operation 406, the metal oxide layer 306 is masked to create concealed regions 310a and exposed regions 310b of the metal oxide layer 306. The exposed regions 310b are areas of the surface of the metal oxide layer 306 that are directly exposed to processing, and the concealed regions 310a are areas of the surface of the metal oxide layer 306 that are covered by the masking material 308, thereby blocking processing such as ion implantation. The masking can be accomplished using the masking material 308 such as a photoresist, a selective masking material, or other materials.

If the masking material 308 is photoresist, for example, the masking can be performed using known photolithographic techniques. For example, in one known photolithographic technique, a layer of photoresist is deposited on the metal oxide layer 306. The photoresist is then exposed to light through a mask such that certain portions of the photoresist are exposed to light and become soluble. The solubilized portions of the photoresist are then removed using an etch process, and the remaining photoresist material covers the concealed regions 310a of the metal oxide layer 306.

Figure 3C:
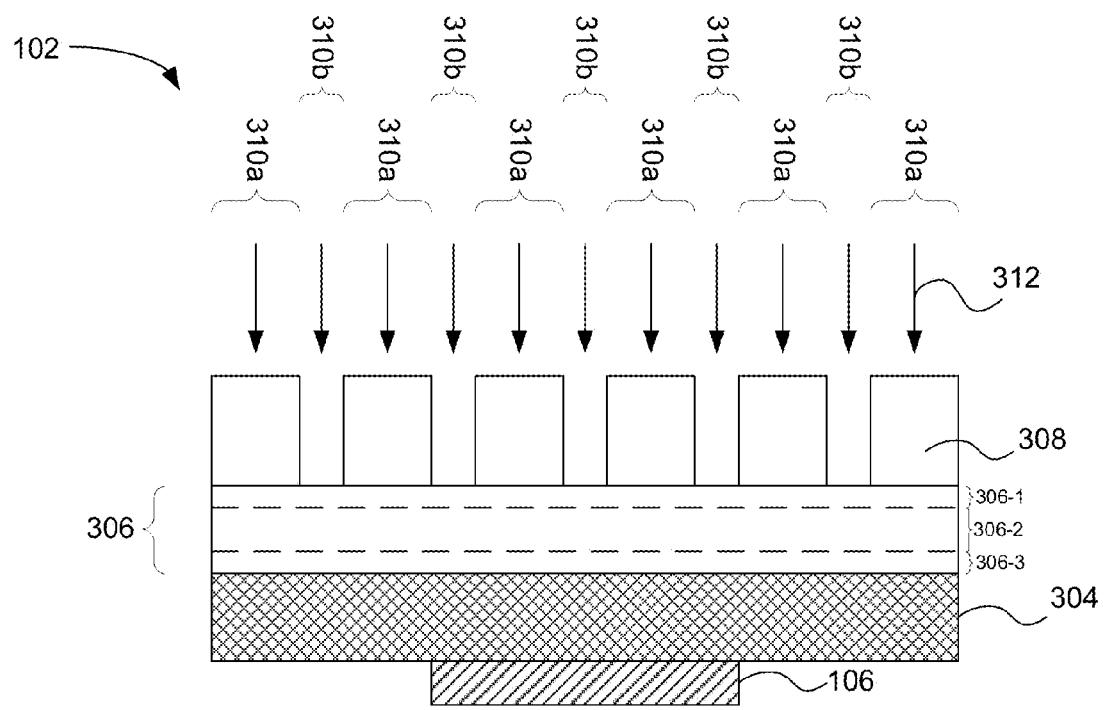

Having concealed regions 310a of the metal oxide layer 306 allows the targeted creation of defect paths in the metal oxide layer 306 beneath the exposed regions 310b. For example, the defect paths can be created in operation 408 by altering the exposed regions 310b of the metal oxide layer 106. FIG. 3C illustrates the alteration of the metal oxide layer 306 according to an embodiment.

Alterations 312 can include, for example, ion implantation. The ion implantation is performed over the entire surface area of the metal oxide layer 306 and the masking material 308 absorbs the ions implanted over the concealed regions 310a, while ions are implanted into the metal oxide layer 306 beneath the exposed regions 310b, thereby creating targeted, localized defect paths. The thickness of the masking layer 308 can be selected so that it is sufficient to absorb the ions and not allow them to penetrate into the metal oxide layer 306.

Figure 5A:
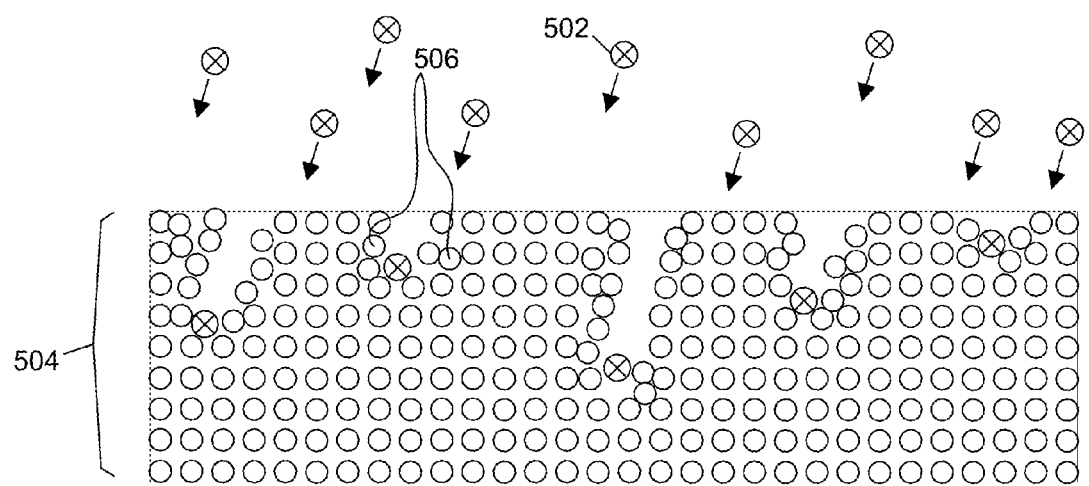
FIG. 5A illustrates the bombardment of ions into a crystal structure.

Ion implantation energy, dose, and other variables can affect the depth of penetration of implanted ions. FIG. 5A illustrates the bombardment of ions 502 into a crystal structure 504. The crystal structure 504 may be, for example, the metal oxide layer 306. The ions 502 disrupt atoms 506 in the crystal structure to create defects in the lattice. For example, various types of defects can include metal interstitials ($Me^+$), metal substitionals (e.g. $Al_{Hf}$), oxygen interstitials ($O_I''$), and oxygen vacancies ($V_O''$).

Metal interstitials can be created by implanting metal ions, for example metal ions comprising a same metal as the metal of the metal oxide layer. Hafnium ($Hf^{+4}$) ions can be implanted into hafnium oxide to create hafnium interstitials ($Hf_I^{+4}$). The hafnium interstitials create a +4 charge imbalance in the metal oxide layer, thereby forming part of a defect path that can be used to create a percolation path with the application of a set voltage. In other embodiments, ion transport and filamentary mechanisms can also be enhanced or enabled by these techniques. For example, the defects can form part of a filament.

Other ions that can be implanted to create defects and defect paths include oxygen ions, different metal ions (e.g. $Al^{+3}$ into hafnium oxide), negatively charged ions (e.g. halide ions such as $F^-$, $Cl^-$, etc.), which can be used to create more charge imbalances in the metal oxide layer 306. Without being bound by theory, the defects serve as traps which can modulate current flow in a trap-mediated SCLC mechanism whereby unfilled traps impede current flow. The traps can be filled during a set operation to reduce the resistivity of the metal oxide layer 306, thereby changing the stored value. Ion implantation serves to create a higher density of spatially distributed traps of desired energy levels. The energy levels can affect retention $I_{ON}/I_{OFF}$ ratios, and programming voltages. Higher densities of traps can cause greater changes in resistivity when they are filled, increasing the on and off current ratio, thereby increasing the distinction between the on and off states of the memory element 102.

Implant energy can be selected to vary the depth that ions penetrate the memory element 102. For example, using a higher implant power can result in implanted ions penetrating through the entire thickness of the masking layer 308 and into the concealed regions 310a of the metal oxide layer 306. In some embodiments, the implant power can be selected to avoid implantation into the concealed regions 310a. In another embodiment, the implant energies are chosen to control the extent of the implantation through the metal oxide layer 306. For example, the energies can be chosen to only implant through the layer 306-1, or through layers 306-1 and 306-2, or through the entire metal oxide layer 306, or some other desired amount of implantation.

Figure 5B:
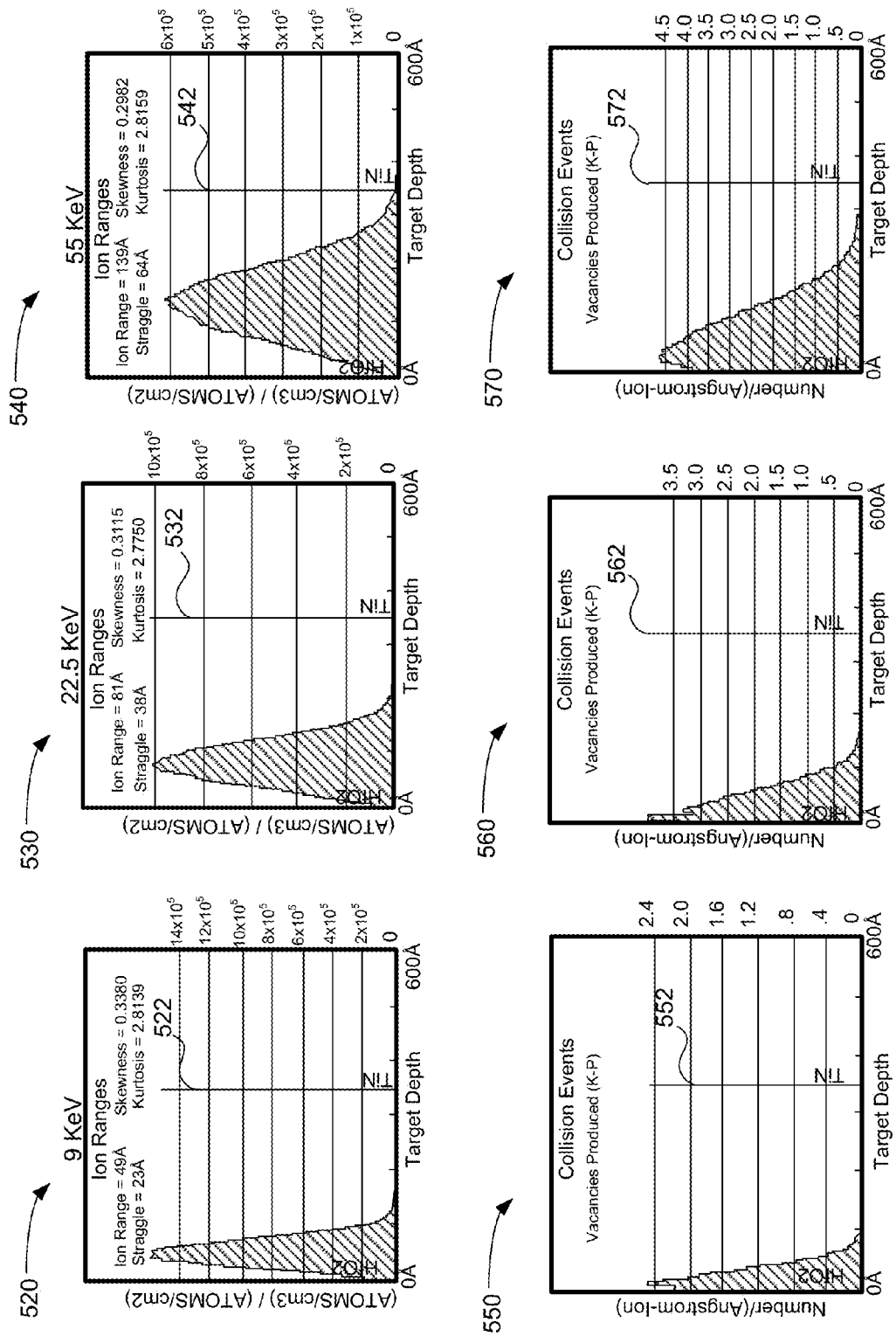
FIG. 5B illustrates ion stopping distribution and vacancies produced when implanting into a metal oxide layer.

FIG. 5B illustrates ion stopping distribution and vacancies produced when implanting into a metal oxide layer. For example, the distribution graphs 520, 530, and 540 show the depth of implantation of 9 keV, 22.5 keV, and 55 keV hafnium ions, respectively, into a 350 Å hafnium oxide layer. Using the graphs 520-570 or similar graphs for hafnium oxide or other materials, and appropriate implant energy can be chosen. Additionally, an appropriate thickness of photoresist or other masking material can be chosen using similar data.

The x-axis of the graphs 520, 530, and 540 represents the depth of the target (i.e. the depth of the hafnium oxide layer (e.g. the layer 306) and the electrode), and the y-axis of the graphs 520, 530, and 540 represents the density of implanted ions in the hafnium oxide layer per dose of ion implantation (defined as the number of ions implanted per unit area of the surface film). The lines 522, 532, and 542 represent the interface between the bottom electrode and the hafnium oxide layer (i.e. 350 Å). Using these graphs, for example, an implantation energy can be chosen that yields the desired ion penetration into a metal oxide layer. Although hafnium implantation into hafnium oxide is shown here, it is understood that similar profiles can be created for other ion and metal oxide combinations.

The graphs 550, 560, and 570 show the number of vacancies at a given depth in the hafnium oxide layer. The x-axis of the graphs represents the depth of the target, and the y-axis represents a number of vacancies in the crystal lattice. The lines 552, 562, and 572 represent the interface between the bottom electrode and the hafnium oxide layer (i.e. 350 Å).

Within the range from the minimum available implant energy to this maximum energy one may tailor the profile of the implanted ions (e.g. using the graphs 520, 530, and 540) and the vacancies (e.g. using the graphs 550, 560, and 570) produced by changing the energy of the implantation and the dose of ions implanted as illustrated in FIG. 5B. That is to say, the lower the ion implantation energy, the greater the localization of the implanted ions and vacancies produced is near the upper interface, and the lower the total number of vacancies produced is. Furthermore, increasing the dose of the implantation increases the number of implanted ions along with the number of vacancies produced. In another embodiment, it is desirable to have the defects (or traps) homogenously produced within the exposed regions 310b of the metal oxide layer 306. Plasma immersion implantation can also be used.

Alterations 312 can also include annealing in operation 410. Any type of anneal can be used, for example, rapid thermal annealing (RTA) at a temperature of between 100° and 1000° Celsius. Other anneals can include rapid thermal oxidation (RTO), which can fill oxygen vacancies, forming gas annealing (e.g. annealing in mixture of $H_2$ and $N_2$ gas), vacuum annealing, etc. The anneal can further alter existing defects or create new defects. The anneal can, in some embodiments, lower the forming voltage of the memory element 102. Annealing can also create stresses within the metal oxide layer 306, which can create or change defects within the metal oxide layer 306.

Figure 3D:
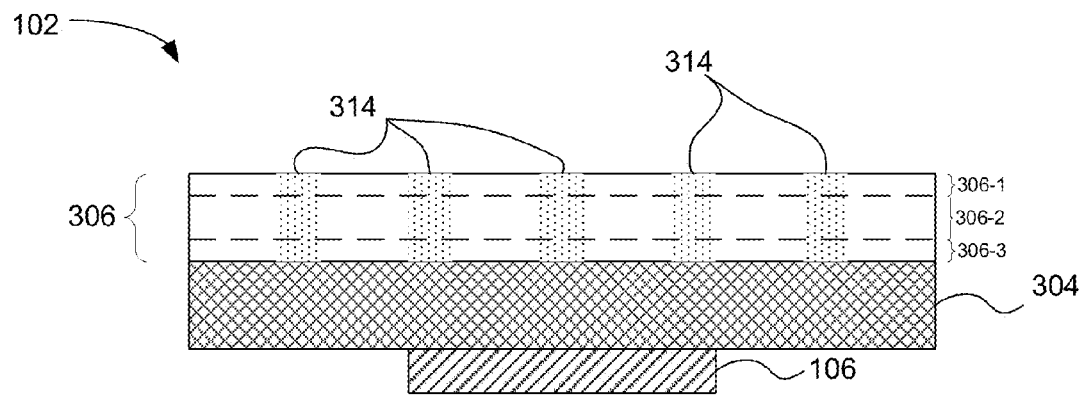

After the annealing is completed in operation 410, a localized channel has been formed in operation 412. FIG. 3D illustrates the memory element 300 once the masking material 308 has been removed and localized channel or localized defect paths 314 have been formed underneath the exposed regions 310b. The defect paths 314 include higher concentrations of defects than the surrounding regions of the metal oxide layer 306. The defect paths 314 can be used to tailor the switching properties of the memory element 300. For example, the defect paths 314 create localized regions in the metal oxide layer 306 that allow for the creation of conduction paths (e.g. percolation paths, filaments, ion transport) and greater control over set, reset, and forming voltages. It is believed that by localizing the conduction paths, greater conductivity changes can be made with smaller voltages, thereby reducing set and reset voltages and increasing on and off current ratios.

In operation 414, an electrode 316 is deposited. The electrode 316 can be any appropriate electrode material, for example titanium nitride, doped silicon, doped polysilicon, tungsten, tungsten nitride, molybdenum nitride, tantalum nitride, molybdenum oxide, cobalt silicide, nickel silicide, palladium silicide, platinum silicide, titanium silicide, other silicides, nickel, platinum, iridium, iridium oxide, ruthenium, or ruthenium oxide. In some embodiments, as described above, one electrode has a higher effective work function than the other. For example, the electrode 316 can be platinum, while the electrode 304 is titanium nitride, or the electrode 316 can be titanium nitride while the electrode 304 is appropriately doped polysilicon. Bipolar operation of this type is described further below.

Figure 3E:
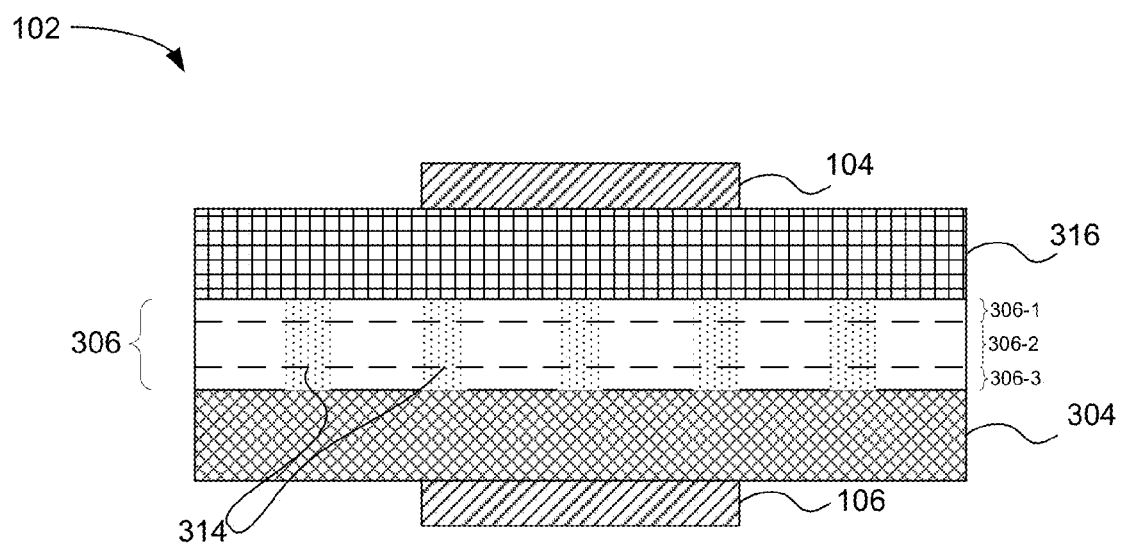

Another signal line 104, for example, a tungsten signal line, can also be deposited over the electrode 316. FIG. 3E illustrates the memory element 300 once it has been completed. The memory element 300, as shown in FIG. 3E is a MIM capacitive stack that has resistive switching memory properties.

IV. Switching Material Properties

Material properties and switching mechanisms of several types of resistive-switching memory elements are described below. For example, a memory element that uses bulk-mediated switching and non-metallic percolation paths is described. It is understood, however, that the technique of forming localized channels and defect paths as described above can be used with any type of resistive switching memory element using any switching mechanism (e.g. percolation path, filament, ion transport, etc.). It is further understood that some memory elements may also be controlled by interface-mediated effects, or by some combination of bulk and interface effects.

A. Bulk-Mediated Switching

In its most basic form, the layers 108 of the memory element 102 include two electrodes (each having one or more materials and/or layers) and one or more layers of one or more metal oxides disposed in between. The memory element 102 generally has a metal-insulator-metal (MIM) capacitor structure, although other structures such as metal-insulator-insulator-metal (MIIM) and metal-insulator-insulator-insulator-metal (MIIIM) can be used as described herein. In other embodiments, additional conductors can be added to the structure, for example to form metal-insulator-metal-insulator-metal (MIMIM) or other capacitor structures. In some embodiments, one or both of the metal layers can be conductive semiconductors (e.g. doped silicon).

In some embodiments, and without being bound by theory, the memory element 102 uses a switching mechanism that is mediated in the bulk of the metal oxide. In one embodiment, the switching mechanism uses non-metallic conductive paths rather than filamentary or metallic conductive paths (see FIG. 6A). In other embodiments, however, any switching mechanism may be used, including metallic filaments or ion transport. Generally, defects are formed in, already exist in the deposited metal oxide, and existing defects can be enhanced by additional processes. Defects may take the form of variances in charge in the structure of the metal oxide. For example, some charge carriers may be absent from the structure (i.e. vacancies), additional charge carriers may be present (i.e. interstitials), or one species (e.g. element) can substitute for another via aliovalent doping (i.e. substitutional). Therefore, by applying a voltage to the memory element 102, the defects, such as traps, can either be filled or emptied to alter the resistivity of a metal oxide and resistive switching memory elements can be formed using these principles.

The metal oxides have any phase (e.g. crystalline and amorphous) or mixtures of multiple phases. The deposited metal oxides can have impurities (i.e. substitutional defects) such as an aluminum atom where a hafnium atom should be, vacancies (missing atoms), and interstitials (extra atoms). Amorphous-phase metal oxides may have increased resistivity, which in some embodiments can lower the operational currents of the device to reduce potential damage to the memory element 102.

B. Defects

The metal oxide includes electrically active defects (also known as traps) in the bulk. It is believed that the traps can be filled by the application of the set voltage, and emptied by applying the reset voltage. Traps can be inherent in the metal oxide (i.e. existing from formation of the metal oxide) or created by doping, and enhanced by doping and other processes. For example, a hafnium oxide layer may include oxygen or hafnium vacancies or oxygen or hafnium interstitials that may form traps which can be used to create percolation paths and alter the conductivity of the hafnium oxide layer.

A metal oxide may include defects that are the result of the process used to form the metal oxide. In other words, the defects may be inherent in the metal oxide. For example, physical vapor deposition (PVD) processes and atomic layer deposition (ALD) processes deposit layers that will always have some imperfections or flaws. These imperfections can generally be referred to as defects in the structure of the metal oxide. The defects can be used to create localized charge variances that can be filled and emptied by applying voltage pulses to the metal oxides. Defects can also be created by doping, which is explained in more detail below. Other processes (e.g. annealing) can be used to change and/or enhance defects of a metal oxide to improve resistive switching characteristics.

V. Memory Element Structures

A. Design Considerations

Described in this section is one example of desirable characteristics of a resistive-switching memory element that uses bulk-mediated switching and percolation paths. However, this example is not limiting, and other conduction mechanisms can also be used with the embodiments described herein.

Generally, as described above, a resistive-switching memory element switches from a low resistance state to a high resistance state and vice versa. Also as described above, a desirable resistive-switching memory element in some embodiments has low set and reset voltages and a high $I_{ON}/I_{OFF}$ ratio. A materials system for achieving these goals includes a metal oxide that:

1. Exhibits bulk-mediated switching
2. Includes a base metal oxide that has a bandgap of greater than 4 electron volts (eV)
3. Has a set voltage of at least one volt per one hundred angstroms of thickness of the base metal oxide
4. Has a leakage current density of less than 40 amps per square centimeter measured at 0.5 V per twenty angstroms of thickness of the base metal oxide in an off state of the memory element Other design considerations may include using more than one metal oxide in a single layer (co-deposition) or multiple layers (stacked), using electrodes that have different work functions, using at least one noble or near-noble metal electrode, using different metal oxides having different bandgaps, and using low leakage materials. The off current is related to the leakage of the material and the size of the device. Generally, the leakage should be low enough that the off current remains low enough to provide adequate separation between the on and off currents (i.e. a sufficiently high $I_{ON}/I_{OFF}$ ratio). Leakage is related to $I_{OFF}$, and the 40 A/cm² measured at 0.5 V per 20 Å of oxide thickness in an off state of the memory element described herein gives an off current that is low enough to give a reliably high $I_{ON}/I_{OFF}$ ratio.

B. Materials

1. Metal Oxides

Specific metal oxides for use as a base layer in a memory element and that use bulk-mediated switching mechanisms according to embodiments of the invention include hafnium oxide, aluminum oxide, tantalum oxide, zirconium oxide, and yttrium oxide. These metal oxides have a bandgap that is greater than 4 eV, indicating that they are more insulating and therefore have a higher resistivity. In some embodiments, higher bandgap (i.e. greater than 4 eV) metal oxides also allow for scaling of set voltage as related to metal oxide thickness (e.g. aliovalently).

These oxides can be doped with each other and additionally, for example, scandium oxide, yttrium oxide, and nickel oxide. Other dopants may include rare earth metals such as lanthanum, cerium, praseodymium, neodymium, gadolinium, erbium, ytterbium, and lutetium and their oxides. Additional dopants may include hafnium, hafnium oxide, titanium oxide, niobium oxide, oxygen, silicon, silicon oxide, nitrogen, fluorine, chromium, and chromium oxide.

Dopants can be selected by considering probable oxidation states that can create defects. For example, hafnium atoms can have a +4 ($Hf^{+4}$) oxidation state, and aluminum atoms can have a +3 ($Al^{+3}$) oxidation state. Aluminum oxide can be doped into hafnium oxide creating charge imbalances by creating substitutional defects where aluminum atoms replace hafnium atoms (i.e. $Al_{Hf}^{-1}$) and vice versa (i.e. $Hf_{Al}^{+1}$). These defects allow for the formation of percolation paths in the bulk of the metal oxide.

Another criterion for selecting dopants can be the difference between the valence (e.g. for a p-type dopant) or conduction (e.g. for an n-type dopant) band of the dopant and the valence or conduction band of the metal oxide. In some embodiments, a difference between the valence bands that is greater than 50 meV can provide deep-level dopants. A deeper trap energy depth can enable higher $I_{ON}/I_{OFF}$ ratios and/or improve retention.

According to some embodiments, the dopant may be the same metal as the metal oxide into which the dopant is doped. For example, a hafnium oxide layer can be doped with hafnium ions. The doping can be performed using implantation, for example. Implantation energy may generally be in the range of 0.5 keV to 10 keV depending on the ion being implanted and the thickness of the metal oxide. This doping can improve yield of the memory elements.

Doping can be performed either isovalently or aliovalently, and can be performed by interdiffusion, implantation, or co-deposition. For example, doping can be performed by interdiffusion by depositing two layers of metal oxides (e.g. hafnium oxide and aluminum oxide or hafnium oxide and titanium oxide). These layers can then be thermally treated by, for example, rapid thermal anneal (RTA), rapid thermal oxidation (RTO) or a forming gas anneal. The thermal treatment causes interdiffusion of defect species between the materials, creating localized charge differences which can serve as trap states.

Another criterion for selecting a metal oxide can be to have a metal nitride electrode and a metal oxide adjacent to the metal nitride electrode. The metal to form the metal oxide and the metal nitride are the same. For example, a memory element can be formed having a titanium nitride electrode and a titanium oxide layer adjacent to the titanium nitride electrode. This serves to stabilize the interface, for example. The memory element can also include other metal oxides (e.g. aluminum oxide or hafnium oxide) in a stacked or co-deposited manner.

In another embodiment, two metal oxides can be stacked in layers to adjust the effective on current of the memory element 102. The first metal oxide can have a smaller on current than the second metal oxide material and the second metal oxide material can have a lower off current than the first metal oxide material. In these embodiments, the memory element 102 can have the lower off current of the second metal oxide material and the lower on current of the first metal oxide material to make the memory element 102 compatible with other device elements, for example a diode or transistor in series with the memory elements.

2. Electrodes

Electrode materials may include titanium nitride, doped silicon, doped polysilicon, tungsten, tungsten nitride, molybdenum nitride, tantalum nitride, molybdenum oxide, cobalt silicide, nickel silicide, palladium silicide, platinum silicide, titanium silicide, other silicides, nickel, platinum, iridium, iridium oxide, ruthenium, or ruthenium oxide. Electrodes can also be alloys such as a ruthenium-titanium alloy or a nickel-titanium alloy. According to some embodiments, one electrode may be a higher work function material, and the other electrode may be a lower work function material. For example, in one embodiment, at least one electrode is a high work function material such as a noble or near noble metal (i.e. a metal with a low absolute value free energy change ($|\Delta G|$) of oxide formation). Noble or near noble metals may include nickel, iridium, iridium oxide, platinum, ruthenium, and ruthenium oxide. The other electrode may be a lower work function material such as titanium nitride, or may also be a noble or near noble material. In other embodiments, one material can be a conductive doped silicon (e.g. n+ doped polysilicon), and the other material can be a higher work function material (e.g. titanium nitride). In some embodiments, the reset pulse at the electrode having the higher work function is a positive pulse (i.e. the higher work function electrode is the anode of the memory element), and in other embodiments, the reset pulse at the higher work function electrode is negative.

In other embodiments, the electrodes can be multi-layer electrodes that can include one or more different materials. For example, an electrode can include a layer of ruthenium and ruthenium oxide, or a layer of iridium, iridium oxide, or platinum with a capping layer of tungsten, tungsten carbonitride, or tungsten carbon. Another potential multi-layer electrode is a tantalum nitride/nickel/tantalum nitride stack. The multi-layer electrodes can be used to improve adhesion properties and performance of memory elements in some configurations and embodiments.

C. Single Layer of Oxide

FIG. 6A illustrates an exemplary memory element 102-6A according to various embodiments. As is described below, various different configurations of memory element 102 are possible; the memory element 102-6A shown in FIG. 6A is one example of a memory element 102 that can be used with memory array 100.

The memory element 102-6A includes two electrodes 304 and 316. The electrodes 304 and 316 can be formed using any appropriate process, such as PVD, CVD, ALD, etc., and can have any appropriate thickness, for example 10-2000 Å.

The bottom electrode 304 is, in some embodiments, nearer a substrate on which the memory element 102-4A is formed. The top electrode 316 is further from the substrate. Although "bottom" and "top" are used to describe the electrodes for some systems, it is understood that the memory element 102-6A may have any orientation relative to the substrate, signal lines, word lines and bit lines, or other components of the memory array 100, and that the memory element 102-6A may be formed in reverse order from what is shown.

In some embodiments, the bottom electrode 304 may include silicon, polysilicon, silicide, titanium nitride, or any other appropriate electrode material. The top electrode 316 can include a higher work function material (e.g. a noble or near noble material) such as platinum, nickel, iridium, iridium oxide, ruthenium, ruthenium oxide, titanium nitride, tantalum nitride, ruthenium-titanium alloys, or nickel-titanium alloys, or can be multi-layer electrodes such as tantalum nitride/nickel/tantalum nitride electrodes.

The electrodes 304 and 316 may be adjacent to or otherwise in electrical communication with signal lines 104 and 106. The signal lines 104 and 106 can be any conductor such as tungsten, aluminum, or copper.

A metal oxide 306 is between the electrodes 304 and 316. The metal oxide 306 may in some embodiments be described as a transition metal oxide, and may be a binary metal oxide, ternary metal oxide, or some other combination of the materials described above. The metal oxide can be deposited using any appropriate technique including dry (CVD, ALD, PVD, PLD, evaporation) and wet (electroless deposition, electrochemical deposition) techniques. If the metal oxide is a binary or ternary metal oxide, the metal oxide 306 may be co-deposited (e.g. co-sputtered or co-injected using ALD or CVD). The electrodes 304 and 316 and the metal oxide 406 are layers 108 of the memory element 102 shown in FIG. 1.

1. Percolation Paths

In some embodiments, percolation paths 616 are believed to originate from electrode 304 and spread toward electrode 316. In other embodiments, the percolation paths 616 can originate at the electrode 316 and spread toward the electrode 304. With the memory elements 102, the anode is the electrode at which the reset pulse is positive (e.g. the electrode 304 or 316). In the memory elements 102, the percolation paths 616 originate from the cathode and, as traps are filled, migrate toward the anode in the presence of the set voltage pulse. The traps themselves are not mobile. The reset pulse subsequently eliminates the percolation paths 616 by emptying previously filled traps. In another embodiment, a mobile defect (e.g. oxygen ions) leads to the formation of the percolation paths.

2. Current Steering Element

The memory element 102-6A (as well as other memory elements 102 described herein) can include an optional complementary device such as a current steering element 618. The current steering element 618 is in series with the memory element 102, and may be, for example, a diode or transistor. The current steering element 618 can be located anywhere with respect to memory element 102 (e.g. between the metal oxide 306 and the electrode 316).

3. Switching Polarity

In some embodiments, bipolar switching can be used where the set and reset voltages have different polarities relative to a common electrical reference. For example, a signal line (e.g. the signal line 104) is connected to a "second" electrode 316, and the signal line is configured to provide switching voltages to the second electrode 316. In some embodiments, the second electrode 316 has a higher work function than the first electrode 304, and the signal line 104 is configured to provide a negative set voltage relative to a common electrical reference, and a positive reset voltage relative to the common electrical reference. The embodiments may include those using a lower work function first electrode 304 (e.g. titanium nitride) and a higher work function second electrode such as platinum or ruthenium. For example, the common electrical reference may be ground (i.e.

0V), the set voltage would then be a negative voltage (e.g. −2V), and the reset voltage would be a positive voltage (e.g. 2V). The common electrical reference can be any voltage, however, such as +2V or −2V.

In other embodiments, the second electrode 316 also has a higher work function than the first electrode 206, and the signal line 104 is configured to provide a positive set voltage and a negative reset voltage relative to a common electrical reference. For example, in a memory element having a doped silicon first electrode 304 (e.g. n-type polysilicon) and a higher work function second electrode 316 (e.g. titanium nitride), the reset voltage can be negative at the second electrode 316.

Generally, in some embodiments, one switching voltage (e.g. the reset voltage) of the memory element can have a first polarity (e.g. a positive polarity) relative to the common electrical reference, and the other switching voltage (e.g. the set voltage) can have a negative polarity relative to the common electrical reference so that the memory element uses bipolar switching. In other embodiments, the switching voltages have the same polarity relative to a common reference and are referred to as unipolar switching. Additionally, the switching voltages can be voltage pulses (e.g. square wave pulses) having a limited duration, for example less than 1 ms, less than 50 µs, less than 1 µs, less than 50 ns, etc. The bipolar switching polarities and materials described here can be used with any of the memory elements described herein, including those shown in FIGS. 6A and 7A-7C.

4. Hafnium Oxide System

One system that meets the criteria of low set, reset, and forming voltages and a high on/off current ratio is a single layer hafnium oxide memory element 102-46A. One example is a system including a hafnium oxide base layer 306, a titanium nitride, silicide, or silicon electrode 304, and a noble or near noble metal (e.g. platinum, nickel, iridium, iridium oxide, ruthenium, ruthenium oxide, tantalum nitride, ruthenium titanium alloys, nickel titanium alloys, or multi-layer electrodes described above) electrode 404. The layers 304, 306, and 316 can be deposited using any deposition technique, such as physical vapor deposition (PVD), atomic layer deposition (ALD), chemical vapor deposition (CVD), or evaporation. ALD may be used to deposit very thin conformal layers in some embodiments. Other embodiments may include a doped silicon electrode 304 (e.g. n-type polysilicon) and a titanium nitride electrode 316, for example.

Figure 6C:
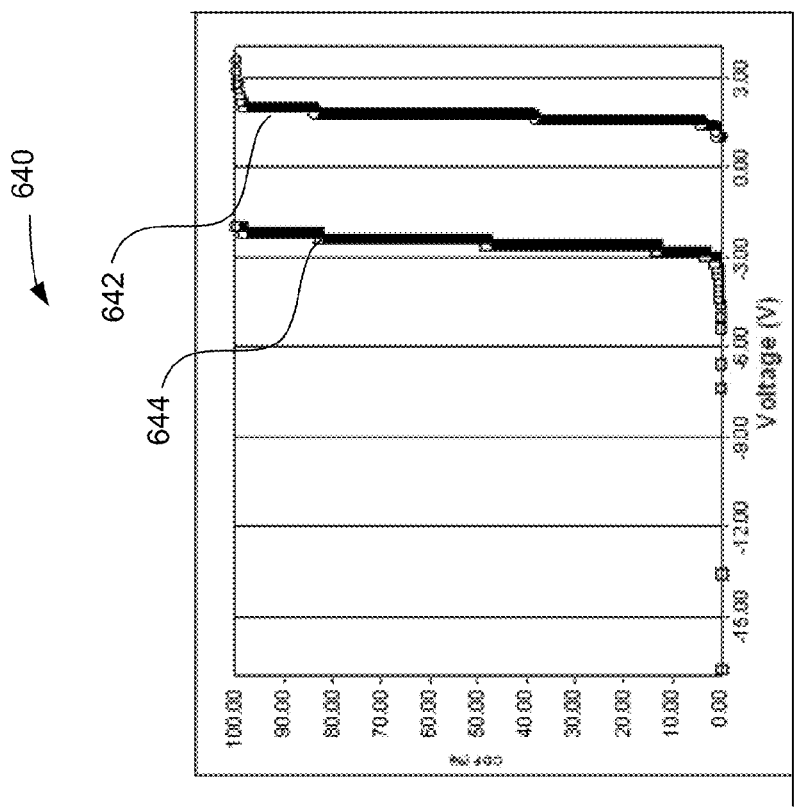
FIGS. 6B and 6C are distribution graphs and showing off current, on current, set voltage, and reset voltage for a sample of memory elements.
Figure 6B:
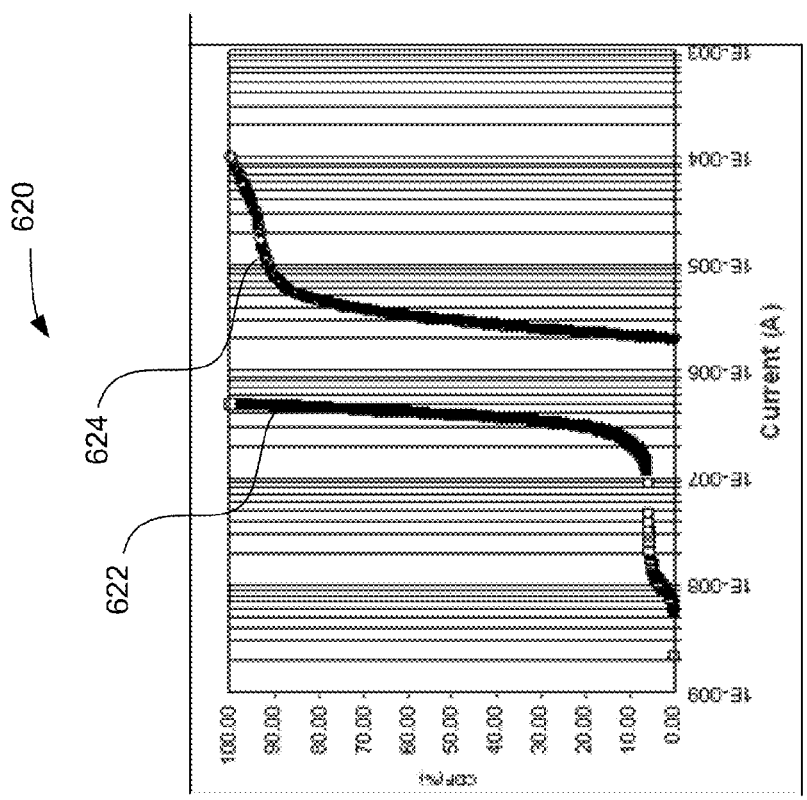

FIGS. 6B and 6C are distribution graphs 620 and 640 showing off current 622 and on current 624 and set voltage 642 and reset voltage 644 for a number of memory elements that were prepared. The traps in deposited hafnium oxide are filled to form percolation paths in response to a set voltage and are emptied (e.g. eliminating the percolation paths) in response to a reset voltage. Memory elements including a 50 Å thick hafnium oxide layer 406 were prepared.

The memory elements are a 50 Å hafnium oxide layer between 1000 Å titanium nitride and 800 Å platinum electrodes. The hafnium oxide layer was deposited using reactive sputtering with a hafnium target in an oxygen and argon containing atmosphere at 500 W and 5 mTorr. The devices were annealed at 750° Celsius (° C.). The $I_{ON}/I_{OFF}$ ratio for these devices shows good separation with low set and reset voltages.

5. Other Single Layer Memory Elements

Other metal oxides 306 may include high bandgap materials such as zirconium oxide, aluminum oxide, yttrium oxide, and tantalum oxide. The metal oxide 306 can also be a binary metal oxide such as a co-deposited hafnium oxide and aluminum oxide layer, a co-deposited hafnium oxide and titanium oxide layer, a co-deposited aluminum oxide and titanium oxide layer, or any combination of the materials described above. The metal oxide 306 may further be a ternary, quaternary, etc. metal oxide.

D. Oxide Stacks

1. Design

Memory elements 102 can also be constructed using multiple layers of oxides or "stacks." The combination of oxides can be used to impart desired characteristics to memory elements. Three types of layers: a base layer, a doping layer, and a defect access layer are described below. The oxide stack is formed in between two electrodes (i.e. an MIIM or MIIIM structure). The stack may also optionally include another electrical device such as a current steering element, described previously. As described above, the metal oxides used for memory elements 102 can be deposited using any appropriate technique including dry (CVD, ALD, PVD, PLD, evaporation) and wet (electroless deposition, electrochemical deposition) techniques.

The operation of the memory elements 102 that include multiple layers of metal oxide is generally the same as that described for a single metal oxide layer memory element. For example, the set and reset pulses and percolation paths described above apply equally to both single layer metal oxide embodiments and multiple layer metal oxide embodiments.

Generally, oxide stacks can be used to impart desired characteristics to a memory element. For example, a defect access layer can increase the effective work function of an adjacent electrode, thereby allowing a lower work function electrode to be used. In some instances, stacking oxides can improve reset voltage distribution and site yield (i.e. the number of working memory elements 102).

i. Base Layer

The base layer is the metal oxide layer in which defects are present and in which the bulk-mediated switching takes place. The base layer is, in some embodiments, a high-bandgap (e.g. greater than 4 eV) material that preferably has leakage of less than 40 A/cm$^2$ in the off state measured at 0.5 V per 20 Å of thickness of the metal oxide, and the memory element has a set voltage of at least one volt per 100 Å of the base layer. In other embodiments, an increase in the thickness of the metal oxide of 100 Å can result in an increase of the set voltage of 1 V.

Doping into the base layer to create defects including traps can generally be isovalent or aliovalent and performed using a variety of techniques, for example: interdiffusion (using, for example, a doping layer and an anneal), implantation, and co-deposition. Aliovalent doping is described in further detail in the section regarding the doping layer.

Co-deposition describes techniques where multiple materials are deposited in one layer. For example, a hafnium oxide layer with an aluminum oxide dopant can be co-deposited. In one example, using reactive sputtering, an aluminum target and a hafnium target are bombarded in an oxygen and argon atmosphere. The concentration of the dopant in the layer can be determined by the power used on the dopant target. Other co-deposition techniques, including ALD co-injection can also be used. For example, with ALD co-injection, two sources metals are co-injected with an oxidant. Another embodiment utilizes the relative number of ALD deposition cycles of the dopant to the base metal oxide to adjust the effective doping concentration (e.g. nanolaminates).

Implantation such as ion implantation can be used to introduce dopants into metal oxides. If doping is performed using ion implantation, dopants may be the metals listed above, rather than their oxides.

ii. Doping Layer

A doping layer is another metal oxide layer adjacent to the base layer. The doping layer diffuses into the base layer or interdiffuses with the base layer when the stack is annealed or otherwise thermally treated (e.g. rapid thermal anneal (RTA), rapid thermal oxidation (RTO), rapid thermal forming gas anneal (RTF)). For example, using an aluminum oxide base layer, a titanium oxide doping layer can be deposited between the cathode and the base layer to create additional defects including substitional defects in the base layer.

The doping layer can be chosen to aliovalently dope into the base layer. For example, the base layer may be hafnium oxide and the doping layer can be aluminum oxide. A typical defect species of hafnium oxide is $Hf^{+4}$, and a typical defect species of aluminum oxide is $Al^{+3}$. $Al^{+3}$ ions displace $Hf^{+4}$ ions in the hafnium oxide layer, thereby creating defects and traps. In some embodiments, a doping layer (e.g. titanium oxide) may have the same most common oxidation state (e.g. +4) as the base layer. In these cases, aliovalent doping may still occur when other species having different oxidation states (e.g. $Ti^{+3}$) diffuse into the base layer.

iii. Defect Access Layer

A defect access layer is a layer between a positive electrode (e.g. the electrode 316) of the memory element 102 and the base layer. The defect access layer is a thin layer (i.e. 25% as thick as the base layer or less) that allows the electrode to "see" and access the defects in the base layer while in some embodiments reducing currents because of the increased resistivity of the defect access layer.

In some embodiments, one electrode has a higher work function that the other electrode. In these embodiments, the defect access layer is adjacent to the high work function electrode. The defect access layer can increase the effective work function of the adjacent electrode, thereby allowing the use of less noble or non-noble electrodes.

Additionally, depending on the materials chosen, the electrode 304 may better adhere to the metal oxide of the defect access layer 722 than the metal oxide of the base layer 702. Therefore, the defect access layer 722 can be used in materials systems to promote physical integrity of the memory element 102.

In another embodiment, the defect access layer can be a thin (e.g. less than 50 Å or less than 20 Å) stable oxide such as aluminum oxide. This facilitates the use of non-noble electrodes for the higher work function electrode (e.g. the electrode 316). In other embodiments, the defect access layer 722 can be zirconium oxide or titanium oxide.

2. Structural Examples

Figure 7A:
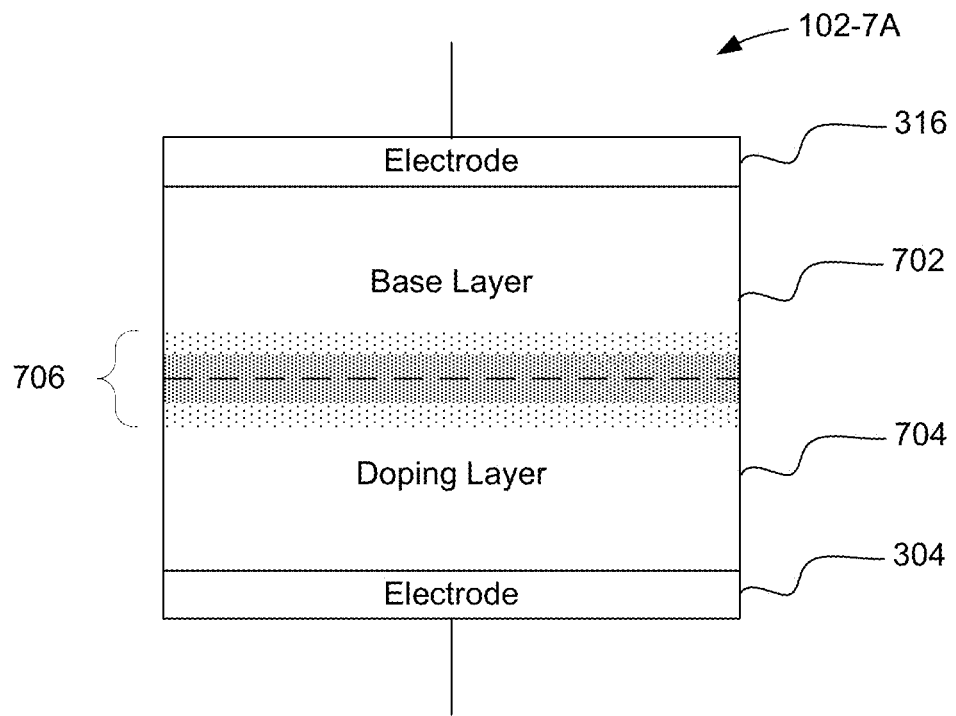
FIG. 7A illustrates a memory element using a stacked oxide system according to various embodiments.

FIG. 7A illustrates a memory element 102-7A using a stacked oxide system according to various embodiments. The memory element 102-7A includes the two electrodes 304 and 316, as well as a base layer 702 and a doping layer 704. The base layer 702 may, in some embodiments, be a transition metal oxide with a bandgap greater than 4 eV such as hafnium oxide, aluminum oxide, tantalum oxide or other materials described herein. The doping layer 704 is another material such as titanium oxide, scandium oxide, yttrium oxide, niobium oxide, or other doping materials described herein. In some embodiments, the doping layer 704 can be chosen so that the metal of the doping layer 704 has a different most common oxidation state than the metal of the base layer 702 (e.g. the base layer may be hafnium oxide with a $Hf^{+4}$ oxidation state and the doping layer can be aluminum oxide with an $Al^{+3}$ oxidation state). The doping layer 704 can have any appropriate thickness, and in some embodiments can be approximately as thick as the base layer 702, or can be between 25-200% as thick as the base layer, 10-500% as thick as the base layer, etc. as is appropriate for a specific materials system.

The memory element 102-7A includes an interdiffused region 706. The interdiffused region 706 can be formed by annealing the memory element 102-7A, for example at 300-1000° Celsius (° C.) for ten seconds (s) to four hours or more. The annealing causes the migration of charged species within the crystalline structure thereby forming or deepening defects and traps which can be used to form percolation paths.

Figure 7B:
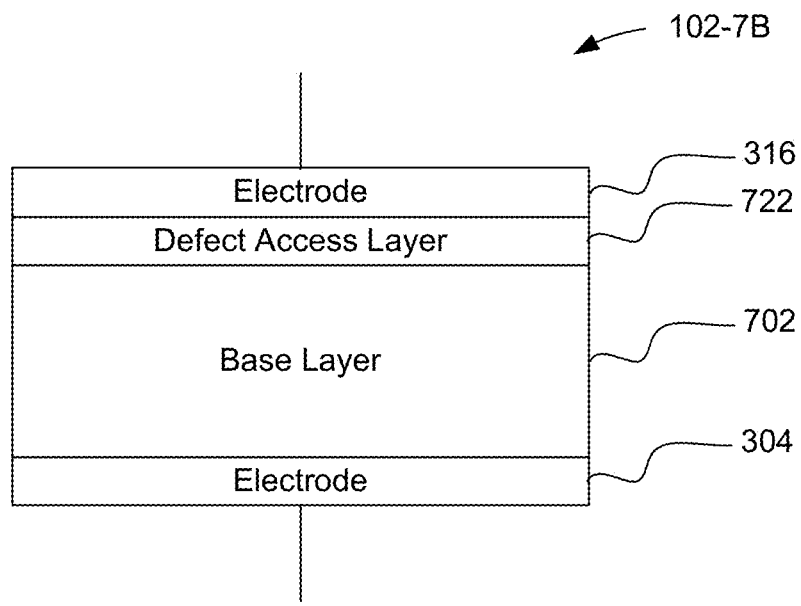
FIG. 7B illustrates a memory element that includes a defect access layer.

FIG. 7B illustrates a memory element 102-7B that includes a defect access layer 722. The defect access layer 722 is a thin layer of material (e.g. less than 25% the thickness of the base layer 702) that can be used to provide access to the defects in the base layer 702 and increase the effective work function of the electrode 316. The material for the defect access layer 722 may be selected from the same group as the doping materials, such as titanium oxide, niobium oxide, rare earth oxides, etc. For example, the base layer 702 may be a 50 Å hafnium oxide or aluminum oxide layer, while the defect access layer 722 is a 10 Å titanium oxide layer. The defect access layer 722 can also serve to dope the base layer 702 in a similar fashion as the doping layer 704. In other embodiments, the defect access layer 722 can be higher-bandgap materials such as aluminum oxide or zirconium oxide.

Figure 7C:
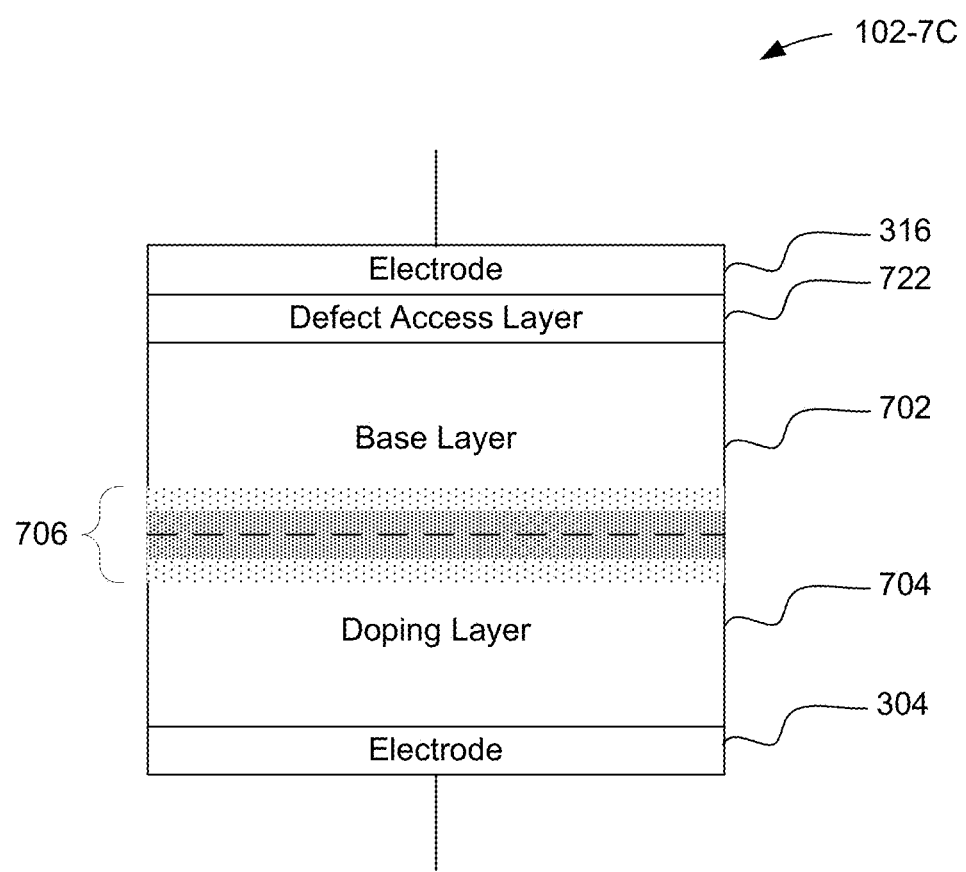
FIG. 7C illustrates a memory element that includes a doping layer, a base layer, and a defect access layer.

FIG. 7C illustrates a memory element 102-7C that includes a doping layer 704, a base layer 702, and a defect access layer 722. The three layer system can use materials chosen to dope from the doping layer 704 into the base layer 702, thereby creating defects in the base layer 702, and to increase the effective work function of the electrode 316. In some embodiments, the same material can be used for the defect access layer 722 and the doping layer 704.

3. Materials Systems Examples i. Hafnium Oxide and Aluminum Oxide

According to one embodiment, a memory element 102-7A can be created using a first electrode 304 that is titanium nitride, silicon, silicide, or a noble metal, a hafnium oxide base layer 702, an aluminum oxide doping layer 704, and a second electrode 316 that is a noble or near-noble metal such as platinum, iridium, iridium oxide, ruthenium, or ruthenium oxide.

In this system, additional defects are created by interdiffusion and aliovalently doping aluminum substitutionally into the hafnium oxide layer. The different oxidation states of hafnium and aluminum create traps, which mediate the bulk-mediated switching mechanism.

ii. Hafnium Oxide and Titanium Oxide

According to another embodiment, a memory element 102-7A can be created using a first electrode 304 that is titanium nitride, silicon, silicide, or a noble or near-noble metal, a hafnium oxide base layer 702, a titanium oxide doping layer 704, and a second electrode 404 that is a noble or near-noble metal such as platinum, iridium, iridium oxide, ruthenium, or ruthenium oxide.

In this system, the resistivity of the titanium oxide doping layer 704 is greater than the resistivity of the hafnium oxide base layer 702. The increased resistivity of the titanium oxide doping layer 704 reduces the effective on current of the memory element 102-7A, which in some systems can protect the memory element and any current steering devices (e.g. transistors or diodes).

iii. Aluminum Oxide and Titanium Oxide

According to one embodiment, a memory element 102-7B can be created using a titanium nitride, silicon, silicide, or noble or near-noble metal electrode 304, an aluminum oxide base layer 702, a titanium oxide defect access layer 722, and a platinum, iridium, iridium oxide, ruthenium, ruthenium oxide or other noble or near-noble metal electrode 316. Alternatively, the electrode can be a non-noble material such as titanium nitride or tantalum nitride. The titanium oxide defect access layer 722 increases the effective work function of the electrode 316, thereby enabling a less noble electrode 316.

According to another embodiment, a memory element 102-7C can be created using the same configuration above and adding a titanium oxide doping layer 704. This memory element includes both doping using the doping layer 704 and access to defects and lower effective work function using the defect access layer 722. According to a further embodiment, a memory element 102-7A can be created using an aluminum oxide base layer 702 and a titanium oxide doping layer 704.

iv. Doped Silicon Examples

In some embodiments, a memory element 102 can include a doped silicon electrode (e.g. n-type polysilicon) and a higher-work function electrode (e.g. TiN). The higher-work function electrode may have a work function that, for example, between 0.1 and 1.5 eV, 0.1 and 1.0 eV, or 0.4 and 0.6 eV greater than the lower-work function electrode. The memory element can take any form 102-7A, 102-7B, or 102-7C.

In one example, a memory element of the form 102-7B has a doped silicon electrode 304 and a titanium nitride electrode 316. The base layer 702 is a higher-bandgap material such as hafnium oxide, tantalum oxide, zirconium oxide, yttrium oxide, or aluminum oxide. The defect access layer 722 is a material such as titanium oxide, zirconium oxide, or aluminum oxide.

v. Other Materials Systems

Various other combinations of materials can be created by using complementary materials. For example, the base layer can be any transition metal oxide having a bandgap greater than 4 eV, a set voltage of greater than 1V per 100 Å of thickness, and a leakage current density less than 40 A/cm$^2$ at 0.5 V per 20 Å of metal oxide in the off state. Examples include hafnium oxide, aluminum oxide, tantalum oxide, and zirconium oxide. The other layers can also be transition metal oxides, such as titanium oxide or niobium oxide. The other layers can be chosen because they are materials that exhibit high resistivity or other desirable characteristics. Some other examples include titanium oxide/hafnium oxide/titanium oxide stacks, hafnium oxide/yttrium oxide stacks, and yttrium oxide/hafnium oxide/yttrium oxide stacks.

Other characteristics can also be used to determine the composition of the memory element. For example, a memory element 102-7A can have a base layer 702 of one metal oxide and a doping layer 704 of a different metal oxide. For example, the base layer 702 can have a bandgap greater than four electron volts, and the doping layer 704 can aliovalently dope into the base layer 702. Another consideration when selecting metal oxide can be the electron affinity of the metal oxide. For example, the base layer 702 can have a higher electron affinity than the doping layer 704.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a resistive switching memory element comprising:
   forming a first electrode;
   forming a metal oxide layer on the first electrode;
   masking the metal oxide layer to create exposed regions and concealed regions of a surface of the metal oxide layer; and
   altering the exposed regions of the metal oxide layer and creating localized defect paths beneath the exposed regions.

2. The method of claim 1, wherein altering comprises implanting ions into the metal oxide layer.

3. The method of claim 2, wherein the ions are chosen from the group consisting of metal ions, halide ions, and oxygen ions.

4. The method of claim 2, wherein implanting ions comprises creating defects comprising at least one of oxygen vacancies, metal interstitals, and oxygen interstitals.

5. The method of claim 1, wherein masking comprises depositing and patterning photoresist on the metal oxide layer.

6. The method of claim 1, wherein the metal oxide layer is selected from the group consisting of hafnium oxide, titanium oxide, aluminum oxide, zirconium oxide, niobium oxide, hafnium titanium oxide, hafnium aluminum oxide, lanthanum oxide, and molybdenum oxide.

7. The method of claim 1, wherein a first work function of the first electrode is less than a second work function of the second electrode.

8. The method of claim 7, further comprising: applying a set pulse to create non-metallic percolation paths in the metal oxide layer; and
   applying a reset pulse to destroy the non-metallic percolation paths.

9. The method of claim 8, wherein applying the set pulse is positive at the second electrode and the reset pulse is negative at the second electrode.

10. The method of claim 1: wherein the first electrode is selected from the group consisting of titanium nitride, silicide, cobalt silicide, nickel silicide, palladium silicide, platinum silicide, titanium silicide, tantalum nitride, molybdenum nitride, tungsten, tungsten nitride, and polysilicon; and
    wherein the second electrode is selected from the group consisting of platinum, ruthenium, ruthenium oxide, iridium, iridium oxide, titanium nitride, and nickel.

11. A method comprising:
    forming a first electrode having a first work function;
    forming a metal oxide layer over the first electrode, the metal oxide layer having a bandgap greater than 4 eV;
    masking the metal oxide layer to create exposed regions and concealed regions in of a surface of the metal oxide layer;
    altering exposed regions of the metal oxide layer and creating defect paths;
    annealing the metal oxide layer to form localized channels from the defect paths; and
    depositing a second electrode having a second work function that is between 0.1 and 1.0 eV different from the first work function.

12. The method of claim 11, wherein the metal oxide layer is selected from the group consisting of: hafnium oxide, aluminum oxide, tantalum oxide, zirconium oxide, yttrium oxide, and lanthanum oxide.

13. The method of claim 11, wherein:
    the first electrode is doped silicon; and
    the second electrode is titanium nitride.

14. The method of claim 11, wherein masking the metal oxide layer comprises depositing photoresist on the metal oxide layer.

15. The method of claim 11, wherein the defect paths comprise non-metallic percolation paths.

16. The method of claim 15, wherein the defect paths include at least one of oxygen vacancies, metal interstitials, metal substitutionals, and oxygen interstitials.

* * * * *